US011770987B2

(12) United States Patent
Yu et al.

(10) Patent No.: US 11,770,987 B2
(45) Date of Patent: Sep. 26, 2023

(54) RESISTIVE RANDOM-ACCESS MEMORY AND METHOD FOR FABRICATING THE SAME

(71) Applicant: UNITED MICROELECTRONICS CORP., Hsinchu (TW)

(72) Inventors: Shu-Hung Yu, Kaohsiung (TW); Chun-Hung Cheng, Kaohsiung (TW); Chuan-Fu Wang, Miaoli County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 251 days.

(21) Appl. No.: 17/489,829

(22) Filed: Sep. 30, 2021

(65) Prior Publication Data
US 2023/0057572 A1 Feb. 23, 2023

(30) Foreign Application Priority Data
Aug. 18, 2021 (CN) .......................... 202110947379.7

(51) Int. Cl.
G06F 12/02 (2006.01)
H10N 70/00 (2023.01)
H10B 63/00 (2023.01)

(52) U.S. Cl.
CPC ........... H10N 70/841 (2023.02); H10B 63/80 (2023.02); H10N 70/026 (2023.02); H10N 70/063 (2023.02); H10N 70/066 (2023.02); H10N 70/8833 (2023.02)

(58) Field of Classification Search
CPC .. H10N 70/841; H10N 70/026; H10N 70/063; H10N 70/066; H10N 70/8833; H10N 70/011; H10N 70/24; H10N 70/826; H10B 63/80

USPC ......................................................... 365/148
See application file for complete search history.

(56) References Cited

U.S. PATENT DOCUMENTS

| | | | |
|---|---|---|---|
| 9,780,302 B2 | 10/2017 | Chen et al. | |
| 9,941,470 B2 | 4/2018 | Yang et al. | |
| 10,396,126 B1 * | 8/2019 | Kim | ................... H10N 70/8833 |
| 10,727,276 B1 * | 7/2020 | Lien | ....................... H10N 50/80 |
| 11,011,704 B2 * | 5/2021 | Li | ......................... H10N 70/821 |
| 2016/0359108 A1 | 12/2016 | Majhi et al. | |
| 2020/0105343 A1 * | 4/2020 | Tu | ....................... H01L 21/3212 |
| 2021/0193911 A1 * | 6/2021 | Tseng | .................... H10N 50/10 |
| 2021/0328139 A1 * | 10/2021 | Lee | .................... H10N 70/8828 |
| 2022/0336740 A1 * | 10/2022 | Kong | ................... H10N 70/841 |

FOREIGN PATENT DOCUMENTS

WO    WO-2019005167 A1 * 1/2019

* cited by examiner

*Primary Examiner* — Fernando Hidalgo
(74) *Attorney, Agent, or Firm* — WPAT, P.C

(57) ABSTRACT

A ReRAM device includes a dielectric layer, a bottom electrode, a data storage layer, a metal covering layer, and a top electrode. The dielectric layer has a recess. At least a portion of the bottom electrode is exposed through the recess. The data storage layer is disposed on a sidewall and a bottom surface of the recess, electrically contacts with the bottom electrode, and has a top portion lower than an opening of the recess. The metal covering layer blanket covers the data storage layer, has an extension portion covering the top portion, and connects to the sidewall of the recess. The top electrode is disposed in the recess, and is electrically contact with the metal covering layer.

12 Claims, 11 Drawing Sheets

RESISTIVE RANDOM-ACCESS MEMORY AND METHOD FOR FABRICATING THE SAME

This application claims the benefit of People's Republic of China application Serial No. 202110947379.7, filed Aug. 18, 2021, the subject matter of which is incorporated herein by reference.

BACKGROUND

Technical Field

The disclosure relates to a semiconductor device and method for fabricating the same, and more particularly to a resistive random-access memory (ReRAM) device and method for fabricating the same.

Description of Background

A ReRAM device, also known as a memristor, is a memory device using a resistance difference generated by applying a pulse voltage to the metal oxide film of the memory device as the basis to determine the memory state of the data storage, such as "0" and "1". In recent years, with the rise of neural network (NN) technology, such as artificial intelligence (AI) and the internet of thing (IoT), the ReRAM device which has the advantages of high device density, low power consumption, fast programming/erasing speed, capable being stacked in three dimensions and can meet the requirements of electrical synapse applications, is considered as one of the most potential candidate device for the next-generation memory technologies.

However, the RERAM device using transition metal oxide filamentary resistive switching is prone to leakage current paths and lead to read errors that may largely cause high deviation in write/erase operation, and greatly reduces the reliability of the memory device.

Therefore, there is a need of providing an advanced ReRAM device and method for fabricating the same to obviate the drawbacks encountered from the prior art.

SUMMARY

One aspect of the present disclosure is to provide a ReRAM device, wherein the ReRAM device includes a dielectric layer, a bottom electrode, a data storage layer, a metal covering layer, and a top electrode. The dielectric layer has a recess. At least a portion of the bottom electrode is exposed through the recess. The data storage layer is disposed on a sidewall and a bottom surface of the recess, electrically contacts with the bottom electrode, and has a top portion lower than an opening of the recess. The metal covering layer blanket covers the data storage layer, has an extension portion covering the top portion, and connects to the sidewall of the recess. The top electrode is disposed in the recess, and is electrically contact with the metal covering layer.

Another aspect of the present disclosure is to provide a method for fabricating a ReRAM device, wherein the method includes steps as follows: Firstly, a recess is formed in a dielectric layer, through which at least a portion of a bottom electrode is exposed. Next, a data storage layer is formed to cover a sidewall and a bottom surface of the recess, so as to make the data storage layer electrically contact with the bottom electrode. Then, a metal covering layer is formed to blanket over the data storage layer. An etch-back process then performed on the data storage layer and the metal covering layer to make a first top portion of the data storage layer and a second top portion of the metal covering layer both lower than an opening of the recess. Afterwards, a metal sputtering process is performed on the metal covering layer to form an extension portion on the second top portion and covering the first top portion, and to make the extension portion connected to the sidewall of the recess. Subsequently, a top electrode is formed on the metal covering layer and electrically contacting with the metal covering layer.

In accordance with the aforementioned embodiments of the present disclosure, a ReRAM device and method for fabricating the same are provided. A recess is formed in a dielectric layer that disposed above a bottom electrode in a manner of passing through the dielectric layer to expose a portion of the bottom electrode. Then a data storage layer (such as, a transition metal oxide layer) is formed on a bottom surface and sidewalls of the recess, and a metal covering layer (such as, a metal work function layer) is formed on the transition metal oxide layer. Next, the data storage layer and the metal covering layer are etched back to make the top portions of the data storage layer and the metal covering layer both lower than the opening of the recess. After that, a sputtering process is performed on the metal covering layer with a target of metal material identical to or different from that of the metal covering layer, so as to form an extension portion on the top portion of the metal covering layer to cover the data storage layer. Subsequently, the recess is filled with a conductive material to cover the top portion of the metal covering layer to form a top electrode.

By forming the extension portion of the metal covering layer to cover the top portion of the data storage layer, it can avoid the data storage layer direct contact to the top electrode, and block the negative oxygen ions O— in the data storage layer to tunnel into the top electrode causing current leakage. Such that deviation in write/erase operation can be reduced and the operation reliability of the ReRAM device can be greatly improved.

BRIEF DESCRIPTION OF THE DRAWINGS

The above objects and advantages of the present disclosure will become more readily apparent to those ordinarily skilled in the art after reviewing the following detailed description and accompanying drawings, in which:

FIGS. 2A to 2J are cross-sectional view illustrating a series of processing structures for fabricating the ReRAM device according to the method described in FIG. 1.

DETAILED DESCRIPTION

Figure 1:
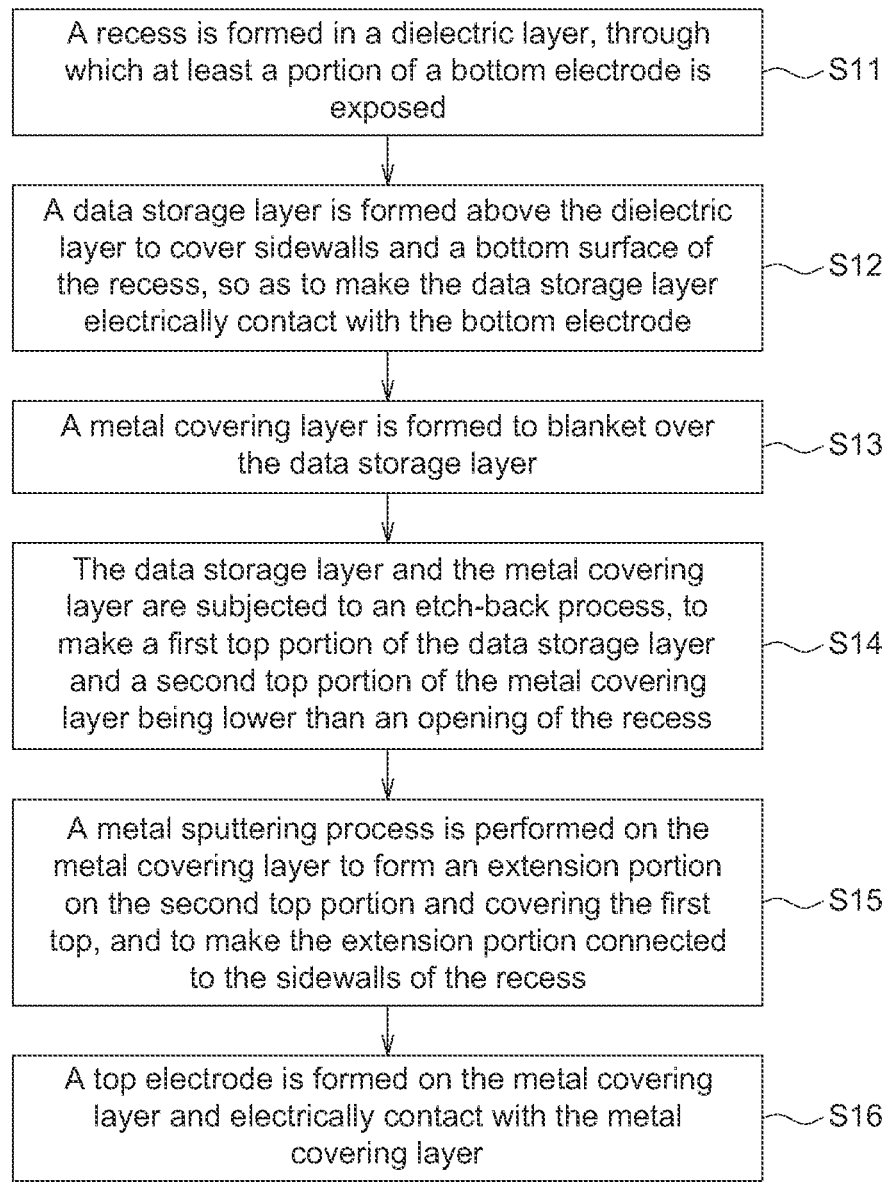
FIG. 1 is a processing flowchart illustrating a method for fabricating a ReRAM device, in accordance with one embodiment of the present disclosure.

The embodiments as illustrated below provide a ReRAM device and method for fabricating the same to prevent current leakage and improve the operation reliability of the memory device. The present disclosure will now be described more specifically with reference to the following embodiments illustrating the structure and arrangements thereof.

It is to be noted that the following descriptions of preferred embodiments of this disclosure are presented herein for purpose of illustration and description only. It is not intended to be exhaustive or to be limited to the precise form disclosed. Also, it is important to point out that there may be other features, elements, steps, and parameters for implementing the embodiments of the present disclosure which are not specifically illustrated. Thus, the descriptions and the drawings are to be regard as an illustrative sense rather than a restrictive sense. Various modifications and similar arrangements may be provided by the persons skilled in the art within the spirit and scope of the present disclosure. In addition, the illustrations may not be necessarily drawn to scale, and the identical elements of the embodiments are designated with the same reference numerals.

FIG. 1 is a processing flowchart illustrating a method for fabricating a ReRAM device 100, in accordance with one embodiment of the present disclosure; and FIGS. 2A to 2J are cross-sectional view illustrating a series of processing structures for fabricating the ReRAM device 100 according to the method described in FIG. 1.

The method for fabricating the ReRAM device 100 includes steps as follows: Referring to step S11: A recess 103 is formed in a dielectric layer 102, through which at least a portion of a bottom electrode 101 is exposed. In some embodiments of the present disclosure, the bottom electrode 101 can be a metal material layer. For example, the bottom electrode 101 may be a copper wire layer formed on a surface of a substrate (not shown).

However, the material constituting the bottom electrode 101 is not limited to this regard. In some embodiments of the present disclosure, the material constituting the bottom electrode 101 may be tungsten (W), titanium (Ti), titanium nitride (TiN), aluminum (Al), nickel (Ni), copper (Cu), zirconium (Zr), niobium (Nb), tantalum (Ta), ytterbium (Yb), terbium (Tb), yttrium (Y), rhodium (La), scandium (Sc), hafnium (Hf), chromium (Cr), vanadium (V), zinc (Zn), molybdenum (Mo), rhenium (Re), ruthenium (Ru), cobalt (Co), rhodium (Rh), cadmium (Pd), platinum (Pt) or an alloy composed of the arbitrary combinations thereof.

Figure 2A:
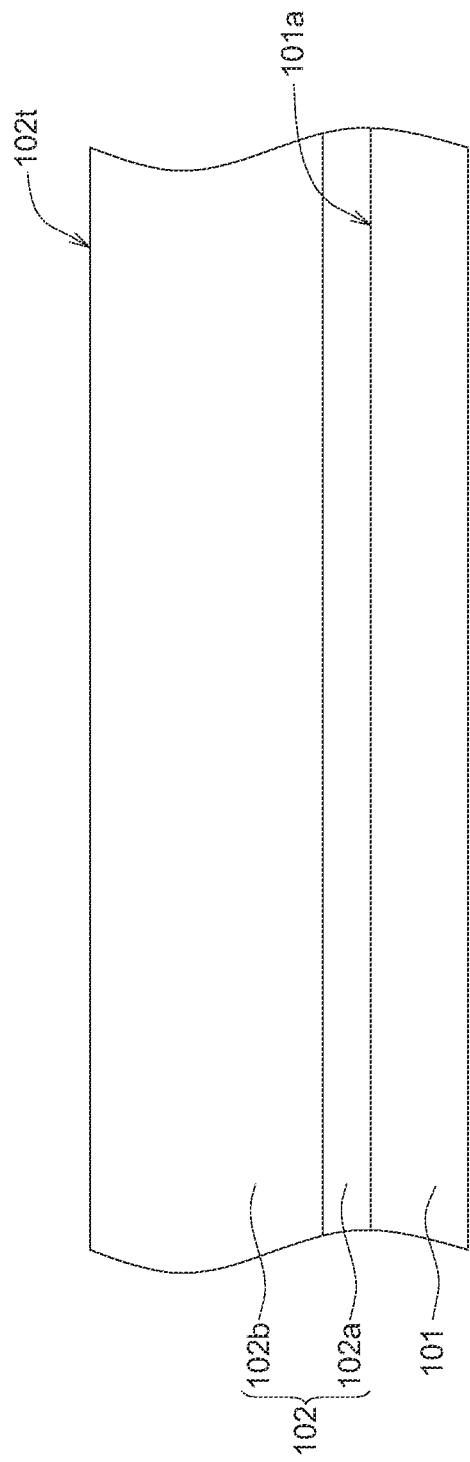

The dielectric layer 102 is formed on a top surface 101a of the bottom electrode 101. The dielectric layer 102 can be a multilayer structure. For example, in some embodiments of the present disclosure, the dielectric layer 102 may include a nitrogen-doped silicon carbide (NDC) layer 102a and an ultra-low dielectric (ULK) material layer 102b (as shown in FIG. 2A). However, in other embodiments, the dielectric layer 102 may be an interlayer dielectric (ILD) (not shown) composed of a single material or multiple materials.

Figure 2B:
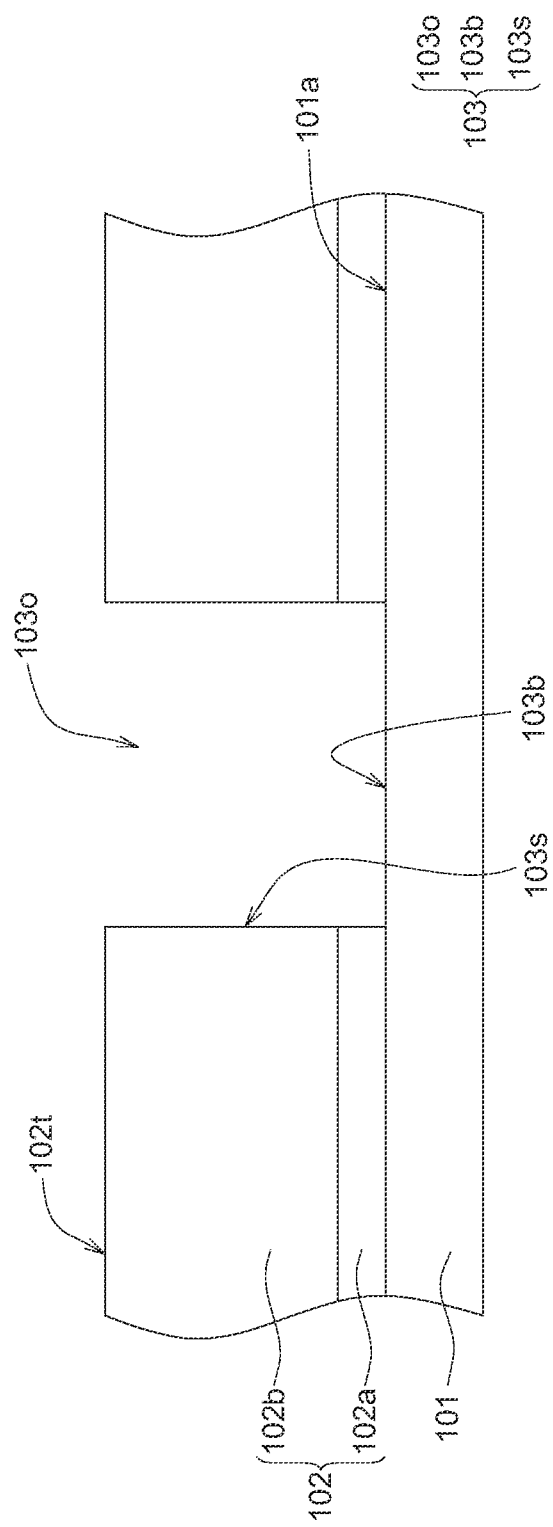

The forming of the recess 103 may include steps of performing a dry etching process on a top 102t of the dielectric layer 102 for removing a portion of the dielectric layer 102 to make the recess 103 extending downward from the top 102t, passing through the dielectric layer 102 and exposing a portion of the top surface 101a of the bottom electrode 101 through the recess 103 (as shown in FIG. 2B).

Next, referring to step S12: A data storage layer 104 is formed above the dielectric layer 102 to cover sidewalls 103s and a bottom surface 103b of the recess 103 (that is, the portion of the top surface 101a of the bottom electrode 101 exposed from the recess 103), so as to make the data storage layer 104 electrically contacting with the bottom electrode 101.

In some embodiments of the present disclosure, the data storage layer 104 may include a transition metal oxide layer. The transition metal oxide layer can be composed of a metal oxide compound represented by the chemical formula AOx. Wherein, A is selected from a group consisting of W, Ti, TiN, Al, Ni, Cu, Zr, Nb, Ta and the arbitrary combinations of these metals. The above-mentioned metal oxide compound can be, for example (but not limited to): hafnium oxide (HfOx), zirconium oxide (ZrOx), aluminum oxide (AlOx), nickel oxide (NiOx), tantalum oxide (TaOx), titanium oxide (TiOx) or the arbitrary combinations thereof.

Figure 2C:
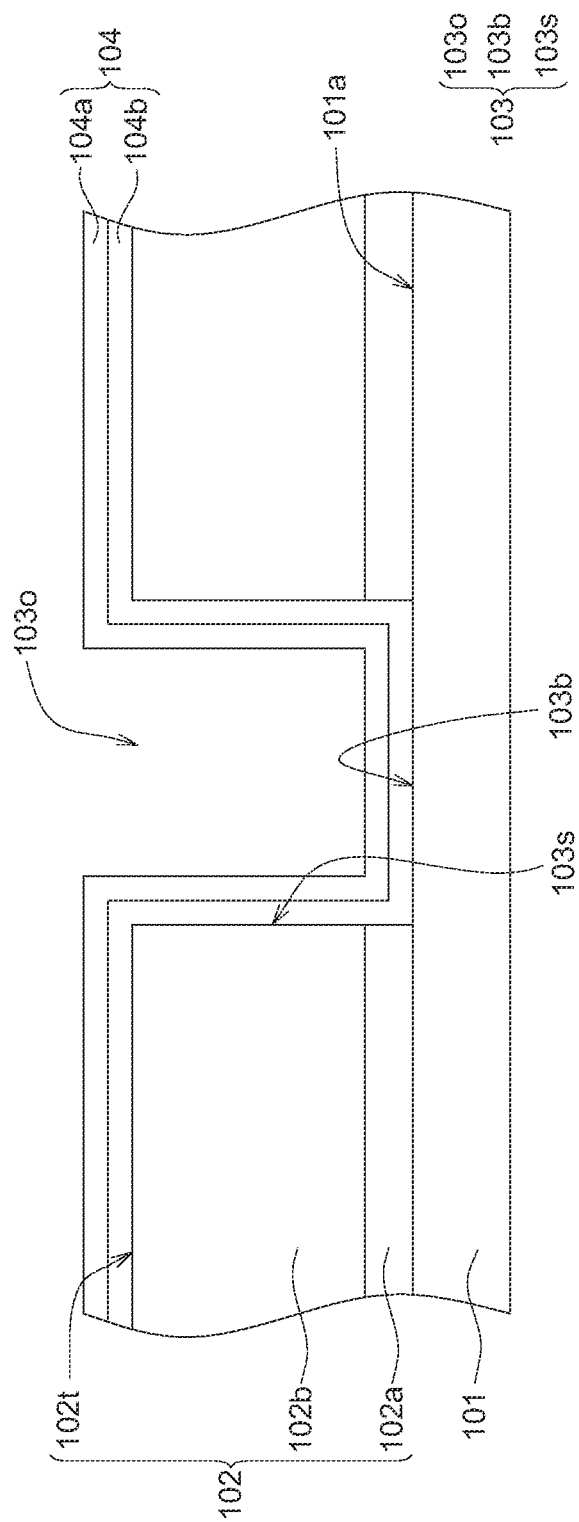

For example, in the present embodiment, the data storage layer 104 includes an oxygen content control layer 104a made of TaOx and an oxygen content control layer 104a and an oxygen-rich barrier layer 104b made of tantalum pentoxide ($Ta_2O_5$) sequentially stacked on the dielectric layer 102 and covering on the sidewalls 103s and the bottom surface 103b of the recess 103 (as shown in FIG. 2C). However, the material and structure of the data storage layer 104 are not limited to this regard. In some other embodiments, the data storage layer 104 may be a single-layer structure composed of a single metal oxide compound, or a multi-layer structure composed of multiple metal oxide compounds.

Figure 2D:
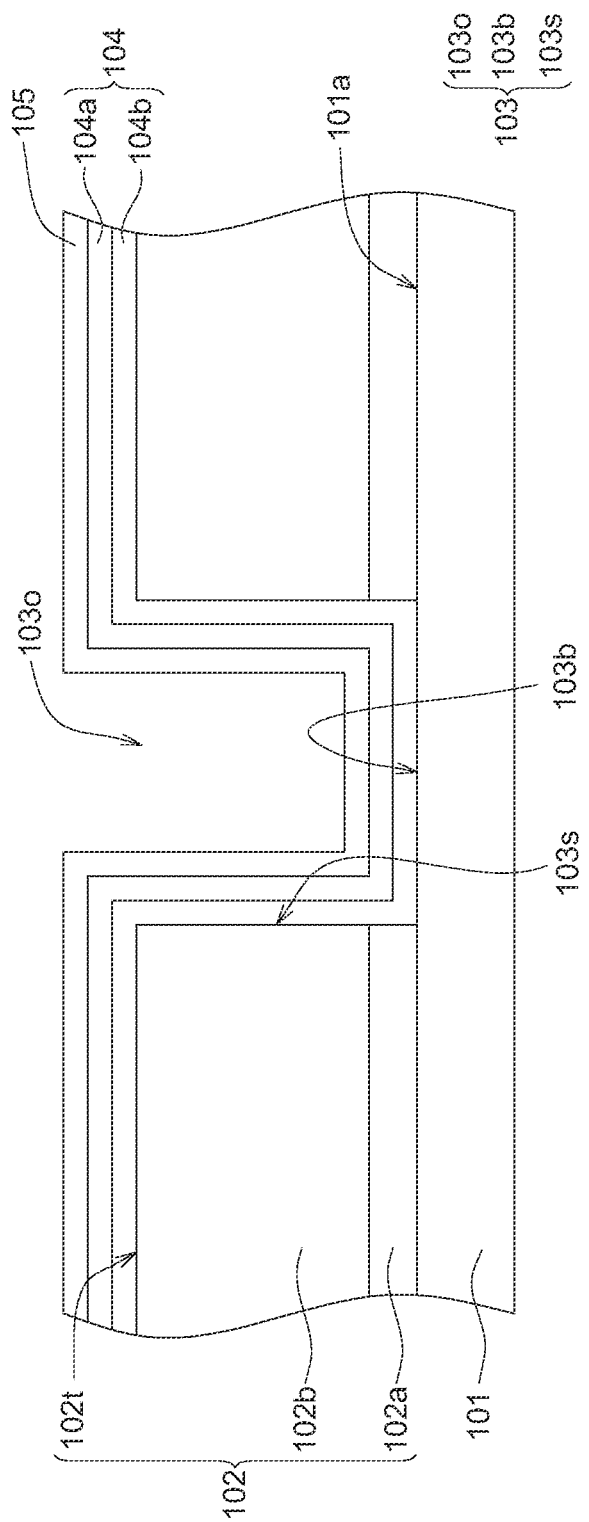

Then, referring to step S13: A metal covering layer 105 is formed to blanket over the data storage layer 104 (as shown in FIG. 2D). In some embodiments of the present disclosure, the metal covering layer 105 can be a work function layer, including at least one metal element, selected from a group consisting of Co, Ni, lead (Pb), gold (Au), Re, iridium (Ir), Ti, Hf, Pt, Ru, Al and the arbitrary combinations thereof. In the present embodiment, the metal covering layer 105 can contain the metallic element Ir.

Thereafter, referring to step S14: The data storage layer 104 and the metal covering layer 105 are subjected to an etch-back process, to make a first top portion 104t of the data storage layer 104 and a second top portion 105t of the metal covering layer 105 both lower than an opening 103o of the recess 103.

Figure 2E:
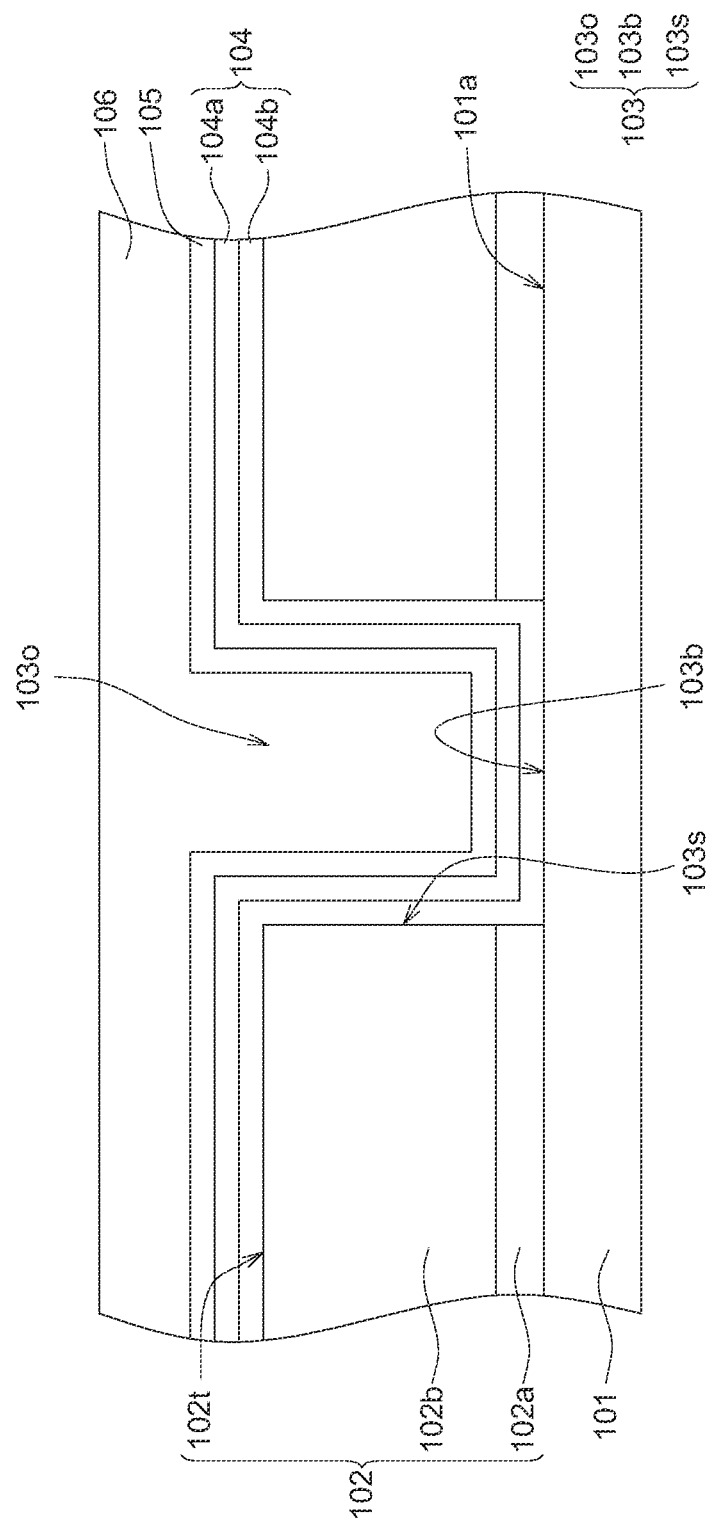
Figure 2F:
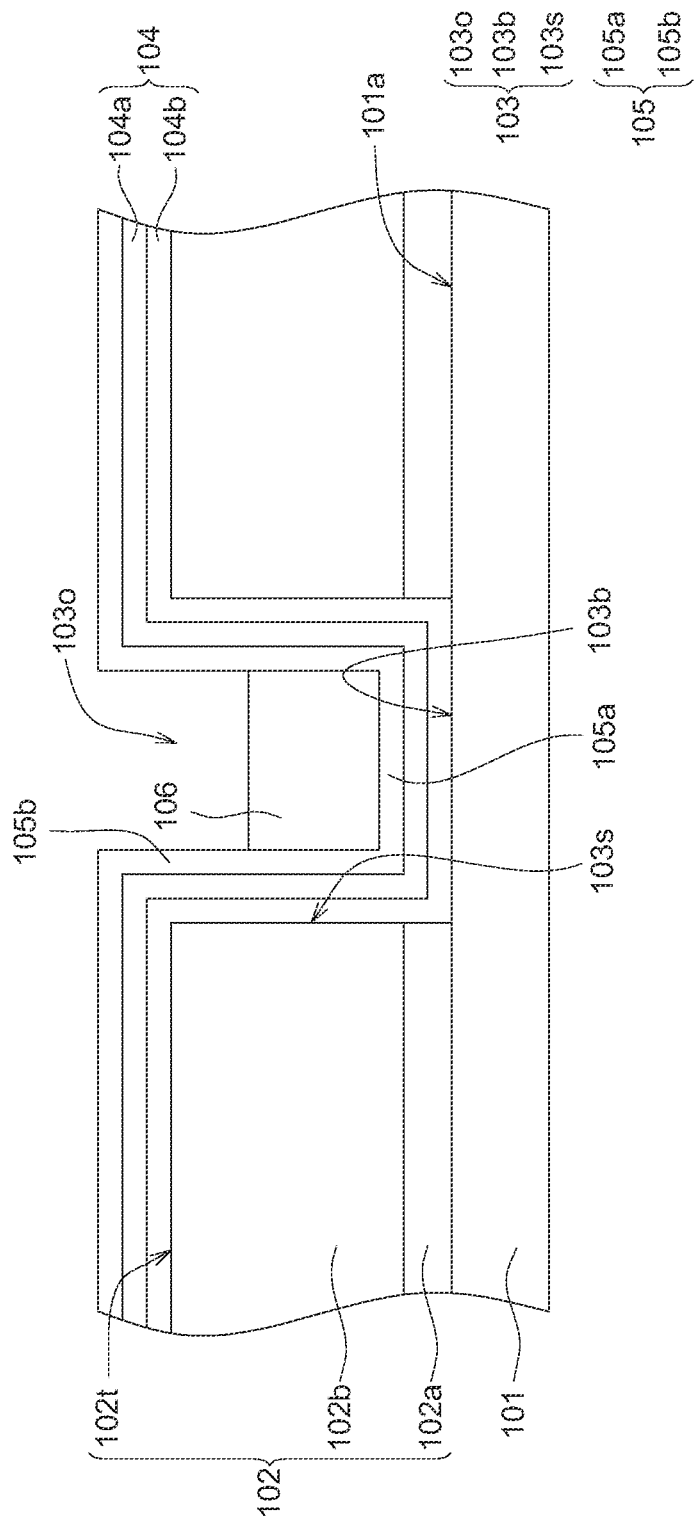
Figure 2G:
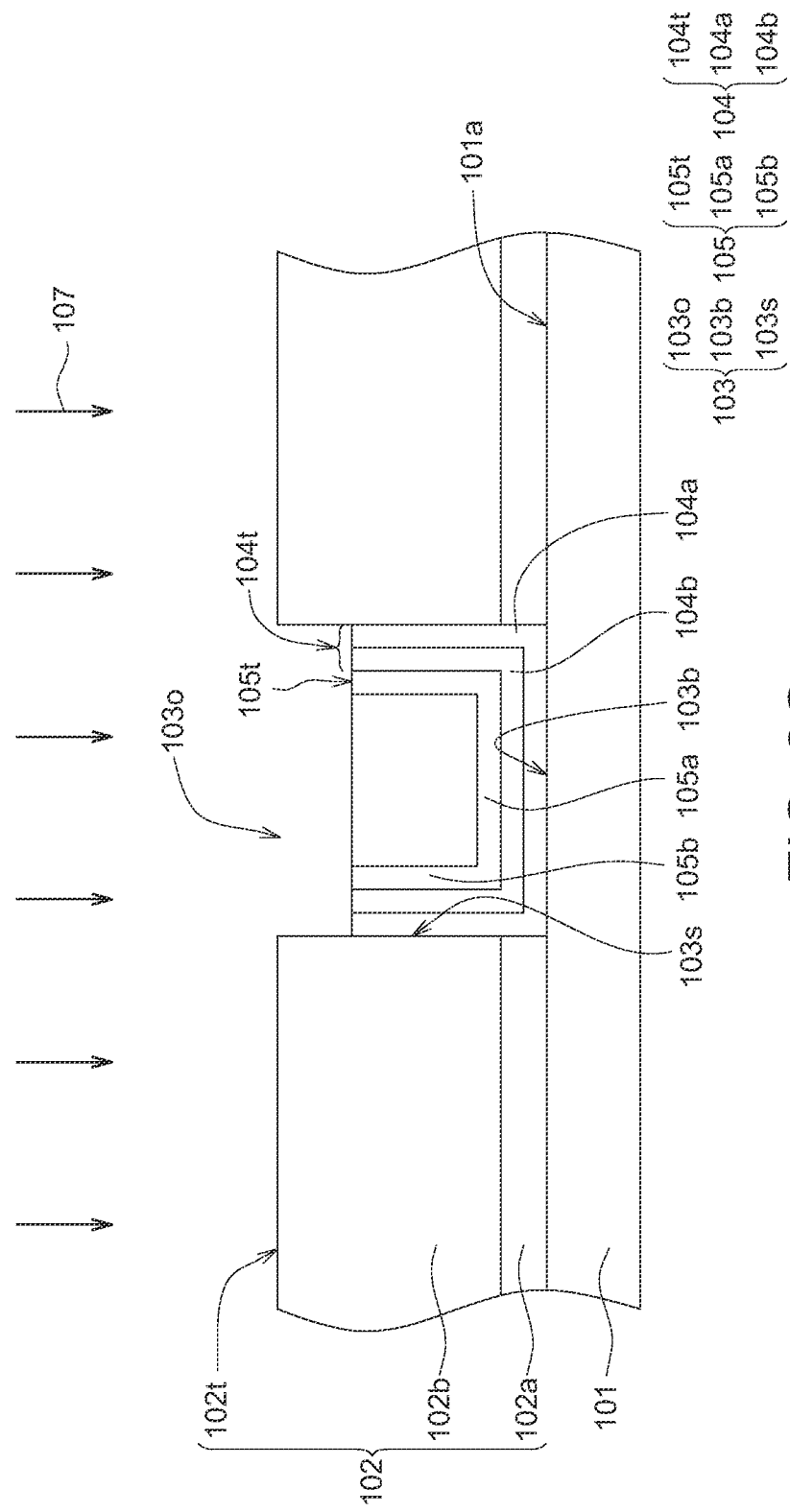

In some embodiments of the present disclosure, the etch-back process includes steps as follows: Firstly, a photoresist layer 106 is formed on the metal covering layer 105 to fill the recess 103 (as shown in FIG. 2E); and then the photoresist layer 106 is etch back to remove the portion of the photoresist layer 106 disposed above the opening 103o of the recess 103, leaving another portion of the photoresist layer 106 that is only partially filled in the recess 103, and covers on a first portion 105a of the metal covering layer 105 that is disposed on the bottom surface 103b of the recess 103, so as to expose a second portion 105b of the metal covering layer 105 that is disposed on the sidewall 103s of the recess 103 (as shown in FIG. 2F). Next, an etching gas 107 containing chlorine, oxygen, and helium ($Cl_2/O_2/He$) is used to remove a portion of the data storage layer 104 and a portion of the metal covering layer 105, both of which are outside and adjacent to the opening 103o of the recess 103, so as to make the first top portion 104t of the data storage layer 104 and the second top portion 105t of the metal covering layer 105 both lower than the opening 103o of the recess 103 (as shown in FIG. 2G).

After removing the remaining portion of the photoresist layer 106, referring to step S15: A metal sputtering process 108 is performed on the metal covering layer 105 to form an extension portion 105e on the second top portion 105t and covering the first top portion 104t of the data storage layer 104, and to make the extension portion 105e connected to the sidewalls 103s of the recess 103.

In some embodiments of the present disclosure, the metal sputtering process 108 includes steps of using an ion bombardment formed by plasma bombarding a target (not shown) that has material identical to or different from that of the metal covering layer 105 to knock out the atoms on the surface of the target, and depositing the knocked-out target atoms in the form of gas molecules on the first top portion 104t of the data storage layer 104 and the second top portion 105t of the metal covering layer 105, so as to form the extension portion 105e extending outwards from the second top portion 105t of the metal covering 105, covering the first top portion 104t of the data storage layer 104, and connecting to the sidewalls 103s of the recess 103.

In some other embodiments of the present disclosure, the metal sputtering process 108 may directly use plasma to ion bombard the exposed second portion 105b and the second top portion 105t of the metal covering layer 105, so that the atoms on the surface of the exposed second portion 105b and the second top portion 105t can be knocked out and then deposited on the first top portion 104 of the data storage layer 104 and the second top portion 105t of the metal covering layer 105 to form the extension portion 105e extending from the second top portion 105t of the metal covering layer 105 to the sidewalls 103s of the recess 103.

Figure 2H:
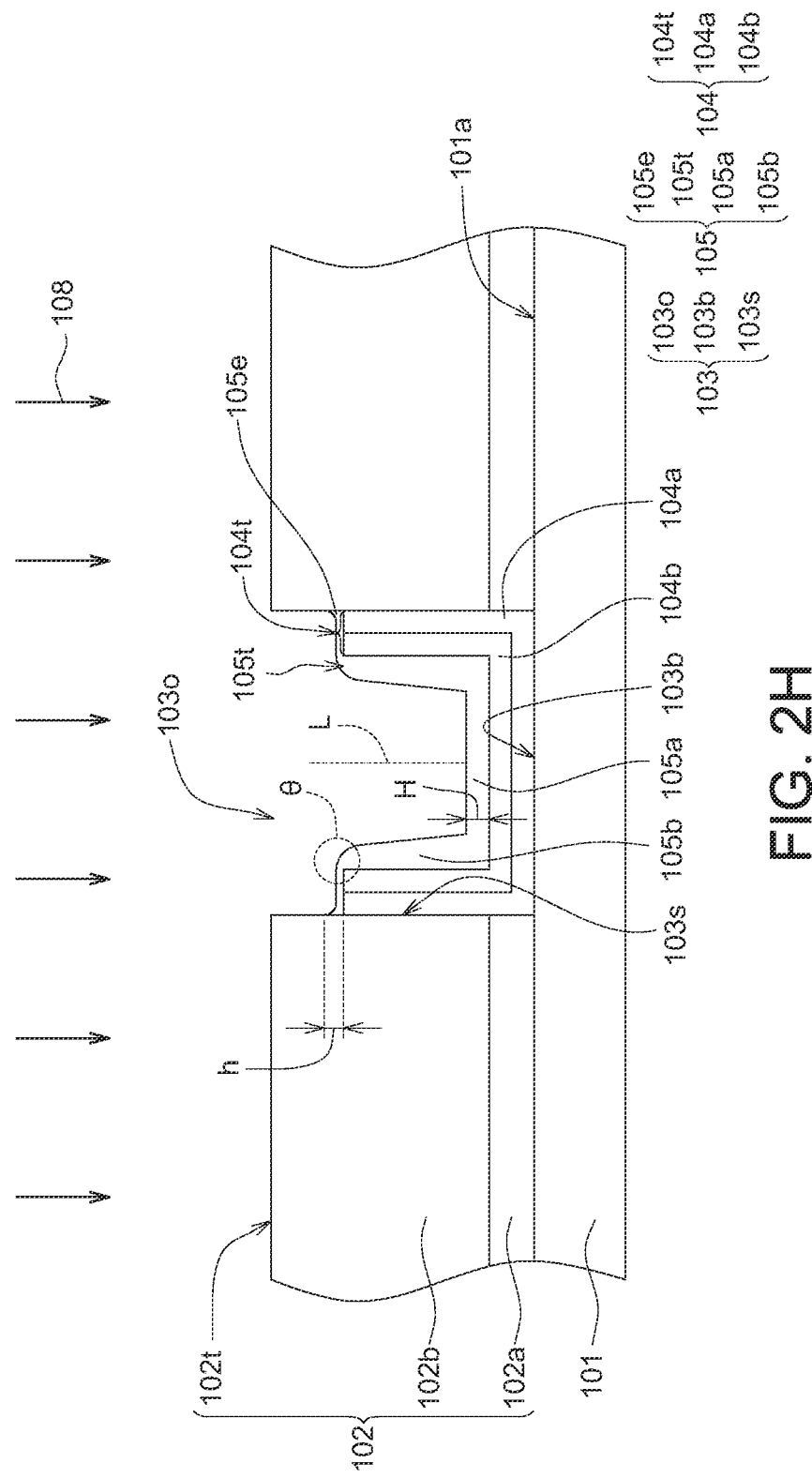
Figure 21:
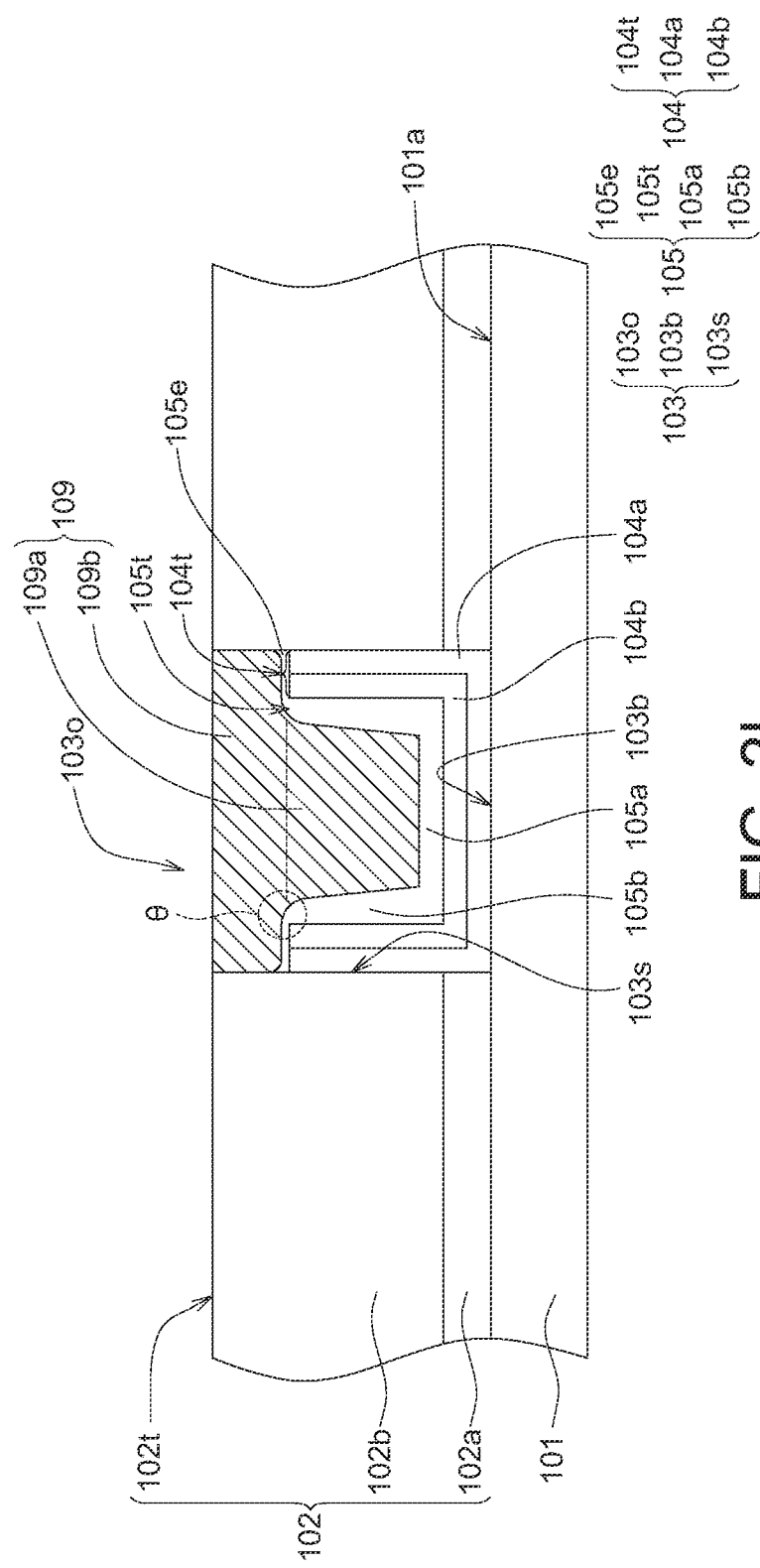

In the present embodiment, the second portion 105b of the metal covering layer 105 has a cross-sectional structure with a wide top and a narrow bottom (e.g. the wedge-shaped cross-sectional structure shown in FIG. 2H). The extension portion 105e has a round corner θ formed at the position where the extension portion 105e of the metal covering layer 105 is connected to the second top portion 105t and close to the central axis L of the recess 103. The thickness H of the first portion 105a of the metal covering layer 105 disposed at the bottom surface 103b of the recess 103 is greater than the thickness h of the extension portion 105e.

After that, referring to step S16: A top electrode 106 is formed on the metal covering layer 105 and electrically contact with the metal covering layer 105. In some embodiments of the present disclosure, the forming of the top electrode 109 includes steps as follows: The recess 103 is filled with a conductive material; and then a planarization process, such as a chemical-mechanical polishing (CMP) process, using the dielectric layer 102 as a stop layer is performed to remove a portion of the conductive material to form the top electrode 109.

In the present embodiment, as shown in FIG. 2I, the top electrode 109 includes a T-shaped structure formed by a plug portion 109a and a landing portion 109b. The plug portion 109a is in contact with the second portion 105b of the metal covering layer 105. The landing portion 109b is disposed on the extension portion 105e of the metal covering layer 105 and covers the extension portion 105e, which can provide a larger processing window allowing the subsequently formed metal interconnection structure 110 fall thereon (shown in FIG. 2J). In some embodiments of the present disclosure, the conductive material for constituting the top electrode 109 may be identical to or different from that for constituting the bottom electrode 101. For example, in the present embodiment, the conductive material for constituting the bottom electrode 101 includes TiN.

Figure 2J:
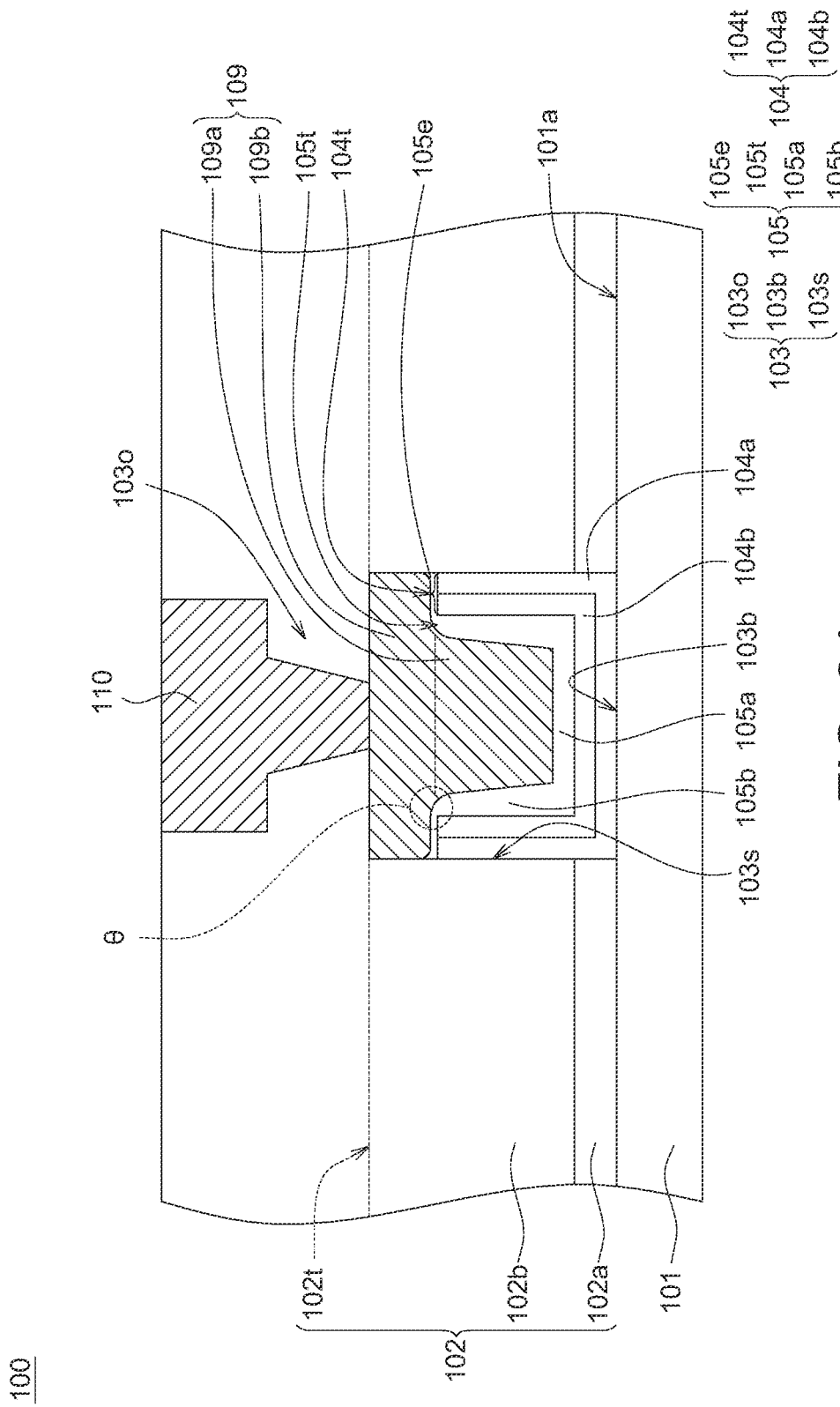

Subsequently, a series of down-stream processes (not shown) are performed, for example, forming the metal interconnection structure 110 to electrically connected to the top electrode 109, meanwhile complete the preparation of the ReRAM device 100 as shown in FIG. 2J. By using the extension 105e of the metal covering layer 105 to cover the first top portion 104t of the data storage layer 104 can prevent the data storage layer 104 from directly contacting with the top electrode 109, so as to prevent the negative oxygen ions O— in the data storage layer 104 from tunneling into the top electrode 109 and causing the current leakage. As a result, deviation in write/erase operation can be reduced, and the operation reliability of the ReRAM device 100 can be greatly improved.

In accordance with the aforementioned embodiments of the present disclosure, a ReRAM device and method for fabricating the same are provided. A recess is formed in a dielectric layer that disposed above a bottom electrode in a manner of passing through the dielectric layer to expose a portion of the bottom electrode. Then a data storage layer (such as, a transition metal oxide layer) is formed on a bottom surface and sidewalls of the recess, and a metal covering layer (such as, a metal work function layer) is formed on the transition metal oxide layer. Next, the data storage layer and the metal covering layer are etched back to make the top portions of the data storage layer and the metal covering layer both lower than the opening of the recess. After that, a sputtering process is performed on the metal covering layer with a target of metal material identical to or different from that of the metal covering layer, so as to form an extension portion on the top portion of the metal covering layer to cover the data storage layer. Subsequently, the recess is filled with a conductive material to cover the top portion of the metal covering layer to form a top electrode.

By forming the extension portion of the metal covering layer to cover the top portion of the data storage layer, it can avoid the data storage layer direct contact to the top electrode, and block the negative oxygen ions O— in the data storage layer to tunnel into the top electrode causing current leakage. Such that deviation in write/erase operation can be reduced and the operation reliability of the ReRAM device can be greatly improved.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A resistive random-access memory (ReRAM) device, comprising:
   a dielectric layer, having a recess;
   a bottom electrode, wherein at least a portion of the bottom electrode is exposed through the recess;
   a data storage layer, disposed on a sidewall and a bottom surface of the recess, electrically contacting with the bottom electrode, and having a top portion lower than an opening of the recess;
   a metal covering layer, blanket covering the data storage layer, having an extension portion covering the top portion, and connecting to the sidewall of the recess; and
   a top electrode, disposed in the recess, and electrically contacting with the metal covering layer.

2. The ReRAM device according to claim 1, wherein the data storage layer comprises a transition metal oxide selected from a group consisting of hafnium oxide (HfOx), zirconium oxide (ZrOx), aluminum oxide (AlOx), nickel oxide (NiOx), tantalum oxide (TaOx), titanium oxide (TiOx) and arbitrary combinations thereof.

3. The ReRAM device according to claim 1, wherein the metal covering layer comprises at least one metal element selected from a group consisting of cobalt (Co), nickel (Ni), lead (Pb), gold (Au), rhenium (Re), iridium (Ir), titanium (Ti), hafnium (Hf), platinum (Pt), ruthenium (Ru), aluminum (Al) and the arbitrary combinations thereof.

4. The ReRAM device according to claim 1, wherein the metal covering layer comprises:
   a first portion, disposed on the bottom surface; and a second portion, disposed on the sidewall and connected the extension portion with the first portion.

5. The ReRAM device according to claim 4, wherein the second portion has a cross-sectional structure with a wide top and a narrow bottom.

6. The ReRAM device according to claim 4, wherein a thickness of the first portion is greater than a thickness of the extension portion.

7. The ReRAM device according to claim 1, wherein the extension portion has a round corner close to a central axis of the recess.

8. The ReRAM device according to claim 1, wherein the top electrode comprises:
   a plug portion, contacting to the second portion; and
   a landing portion, disposed on the extension portion and covering the extension portion.

9. A method for fabricating a ReRAM device, comprising:
   forming a recess in a dielectric layer, through which at least a portion of a bottom electrode is exposed;
   forming a data storage layer to cover a sidewall and a bottom surface of the recess, so as to make the data storage layer electrically contacting with the bottom electrode;
   forming a metal covering layer, blanket over the data storage layer;
   performing an etch-back process on the data storage layer and the metal covering layer to make a first top portion of the data storage layer and a second top portion of the metal covering layer both lower than an opening of the recess;
   performing a metal sputtering process on the metal covering layer to form an extension portion on the second top portion and covering the first top portion, and to make the extension portion connected to the sidewall of the recess; and
   forming a top electrode on the metal covering layer and electrically contacting with the metal covering layer.

10. The method according to claim 9, wherein the etch-back process comprises using an etching gas containing chlorine, oxygen, and helium ($Cl_2/O_2/He$).

11. The method according to claim 9, wherein the metal sputtering process comprises using a target that has material identical to or different from that of the metal covering layer.

12. The method according to claim 9, wherein the forming of the top electrode comprises:
   filling the recess with a conductive material; and
   planarizing the conductive material.

\* \* \* \* \*